Sept. 8, 1964 P. B. SPOHN 3,148,337
TEMPERATURE COMPENSATED SIGNAL-CONTROLLED CURRENT SOURCE
Filed Oct. 1, 1962
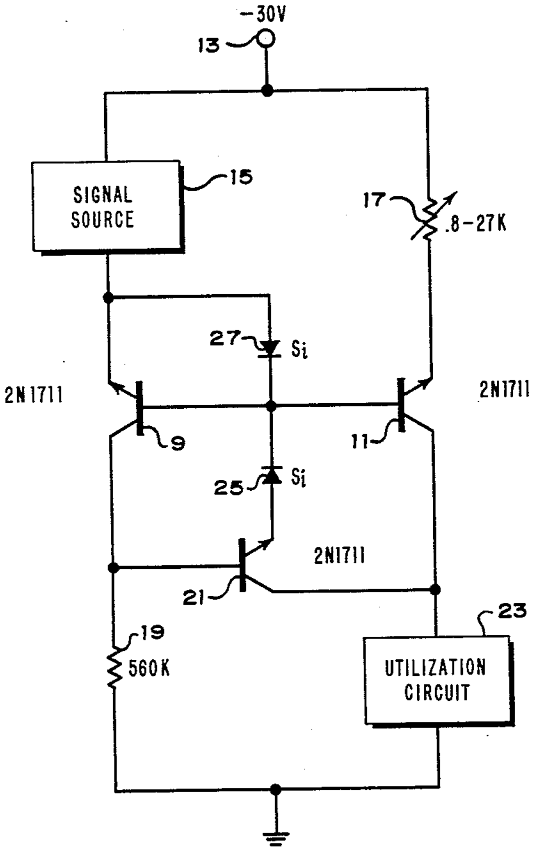
INVENTOR
PHILIP B. SPOHN
BY [signature]
ATTORNEY United States Patent Office 3,148,337

Patented Sept. 8, 1964

3,148,337

TEMPERATURE COMPENSATED SIGNAL-CONTROLLED CURRENT SOURCE

Philip B. Spohn, San Jose, Calif., assignor to Hewlett-Packard Company, Palo Alto, Calif., a corporation of California Filed Oct. 1, 1962, Ser. No. 227,421
2 Claims. (Cl. 330—28)

This invention relates to a temperature compensated circuit which converts an applied signal voltage to a proportional output current over a wide dynamic range of signal values. More particularly, the invention relates to a bridge-like circuit that supplies a wide range of currents which are constant with changes in temperature and load impedance and which are related to the amplitude of an applied voltage by a variable factor.

It is a principal object of the present invention to provide a temperature compensated circuit which supplies a constant current to a load for a given applied voltage.

In accordance with the present invention, this is accomplished by connecting a pair of matched transistors so that changes in the junction bias voltage of one transistor cancels the changes in the junction bias voltage of the other transistor. Changes with temperature in the current gain parameters of the transistors are reduced by including them in a negative feedback circuit.

For an understanding of the principles of the invention, reference is made to the following description of the embodiment thereof as illustrated in the accompanying drawing which shows a schematic diagram of the invention.

Referring to the drawing, there is shown a pair of transistors 9 and 11 having their base electrodes connected together. The emitter electrode of transistor 9 is connected to a negative supply terminal 13 through signal source 15 and the emitter electrode of transistor 11 is connected to the negative supply terminal 13 through resistor 17. The collector of transistor 9 is connected to ground through resistor 19 and is connected to the base electrode of transistor 21. The collector electrode of transistor 11 is connected to ground through utilization circuit 23 and is connected to the collector electrode of transistor 21. The emitter electrode of transistor 21 is connected to the base electrodes of transistors 9 and 11 through silicon diode 25. The base-emitter junction of transistor 9 is shunted by silicon diode 27.

The voltage on the emitter electrode of transistor 9 is determined by the signal from signal source 15. The base-emitter junction of transistor 9 is forward biased by the base current which flows in transistor 21 and in diode 25. Thus, the voltage on the base electrode of transistor 9 equals the signal voltage applied to the emitter electrode from signal source 15 less the base-emitter junction voltage of transistor 9. This base voltage appears on the base of transistor 11 which is also forward biased by the current flowing in transistor 21 and in diode 25. The voltage on the emitter electrode of transistor 11 is thus equal to the voltage on the base electrode less the voltage drop across the base-emitter junction of transistor 11. The voltage thus applied to the emitter electrode of transistor 9 from the signal source 15 appears across resistor 17 in the emitter circuit of transistor 11. In practice, the signal source may be a steady reference voltage. Transistors 9 and 11 are mounted on a common heat sink to insure that both transistors operate at the same ambient temperature. It is known that the base-emitter junction voltage of a transistor is substantially independent of emitter current but varies by a constant amount per degree of temperature change for a given semiconductor material. Since transistors 9 and 11 operate at substantially the same temperature, the base-emitter junction voltages and, hence the voltages of the emitters of each of the transistors remain equal over a wide range of temperatures, independent of the current in each of the transistors. The bridge-type network formed between terminal 13 and ground by serially-connected resistor 17, emitter-collector path of transistor 11 and utilization circuit 23 on one side and by serially-connected signal source 15, emitter-collector path of transistor 9 and resistor 19 on the other side provides a pair of diagonally opposite terminals (the emitters of transistors 9 and 11) across which the voltage remains fixed with temperature. Thus the emitter current in transistor 11 is determined substantially by the value of resistor 17. The portion of the emitter current of transistor 11 which flows in the collector circuit and, hence in utilization circuit 23 is thus stabilized against changes with temperature in the base-emitter junction bias voltages and therefore remains constant for a given value of applied signal from signal source 15.

It is known that the current gain parameter, Beta, of a transistor is not constant but changes with operating temperature. To reduce the effects of changes in this current gain parameter, the base current for transistors 9 and 11 is provided by transistor 21 and silicon diode 25 connected in its emitter circuit. Thus any change in the current flowing in resistor 19 from the collector electrode of transistor 9 and resulting from a change in the current gain parameter of that transistor, appears as a change in the base current of transistor 21. This change in base current is amplified by the current gain of transistor 21 and appears as a change in the base current of transistor 11. The change in the base current of transistor 11 is further amplified by the current gain of that transistor and appears as a change in the emitter current flowing in resistor 17. Since the base-emitter voltage of transistor 21 is related to the signal applied from signal source 15 and to the emitter-collector voltage of transistor 9 less the voltage across resistor 17, any tendency of the base current in transistor 21 to change results in a correcting change in the opposite direction. The loop gain with which the initial change in base current is returned is equal to the current gain of transistor 21 multiplied by the current gain of transistor 11. The current flowing in the utilization circuit 23 is thus stabilized against changes with temperature in the current gain parameter, Beta, of the transistors and against changes with temperature of the emitter-base junction biasing voltages of the transistors. Also, the impedance seen looking into the amplifier circuit from the terminals of utilization circuit 23 is very large due to the fact that the large collector resistance of the transistors is multiplied by the loop gain of the feedback circuit, and typically may be as high as .3 megohm. The current thus applied to the utilization circuit 23 for a given signal applied from signal source 15 is substantially constant with changes in temperature and with changes in the impedance of the utilization circuit 23 over a range, say from zero to one kilohm. Silicon diode 25 is forward biased by the current flowing therethrough to the base electrodes of transistors 9 and 11 and thus shows a constant voltage drop of approximately .7 volt. This voltage drop determines the collector-emitter bias voltage for transistor 9. The reverse biased silicon diode 27 is provided in shunt with the base-emitter junction of transistor 9 to limit the reverse voltage which appears across the junction when utilization circuit 23 is removed.

I claim:

1. A circuit for amplifying signals applied thereto from a signal source, said circuit comprising a pair of gain elements, each having first and second electrodes forming an input circuit and having second and third electrodes forming an output circuit, a bridge network including plural branches connected between junction points, an utilization circuit, means including said utilization circuit and the output circuit of one of said pair of gain elements and forming one of said branches, means including said signal source and the output circuit of the other of said pair of gain elements and forming another of said branches, means connecting the first electrodes of said gain elements together, a third gain element having first and second electrodes forming an input circuit and having second and third electrodes forming an output circuit, means connecting the output circuit of the third gain element to the first and third electrodes of said one gain element, means connecting the input circuit of said third gain element to the first and third electrodes of said other gain element, and means providing a difference of potential between said junction points.

2. A signalling circuit comprising a pair of transistors, each having base and emitter electrodes forming an input circuit and having emitter and collector electrodes forming an output circuit, a bridge network including plural branches connected between junction points, an utilization circuit, impedance means, a series circuit including said utilization circuit, said impedance means and the output circuit of one of said pair of transistors and forming one of said branches, the amplitude of signal in said utilization circuit being related to the value of said impedance means, means including said signal source and the output circuit of the other of said pair of transistors and forming another of said branches, means connecting the base electrodes of said transistors together, a third transistor having base and emitter electrodes forming an input circuit and having emitter and collector electrodes forming an output circuit, means connecting the output circuit of the third transistor to the base and collector electrodes of said one transistor, means connecting the input circuit of said third transistor to the base and collector electrodes of said other transistor, and means providing a difference of potential between said junction points.

References Cited in the file of this patent

UNITED STATES PATENTS 2,691,075 Schwartz -------------- Oct. 5, 1954